United States Patent
Park et al.

(10) Patent No.: US 6,695,684 B2
(45) Date of Patent: Feb. 24, 2004

(54) CHEMICAL MECHANICAL POLISHING APPARATUS HAVING A CLEANER FOR CLEANING A CONDITIONING DISC AND METHOD OF CONDITIONING A POLISHING PAD OF THE APPARATUS

(75) Inventors: Young-rae Park, Suwon (KR); Ho-young Kim, Sungnam (KR); Hong-kyu Hwang, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 118 days.

(21) Appl. No.: 09/969,992

(22) Filed: Oct. 4, 2001

(65) Prior Publication Data

US 2002/0072312 A1 Jun. 13, 2002

(30) Foreign Application Priority Data

Dec. 6, 2000 (KR) ........................................ 2000-73806

(51) Int. Cl.[7] ................................................. B24B 1/00
(52) U.S. Cl. ............................ 451/56; 451/60; 451/285
(58) Field of Search .............................. 451/56, 60, 53, 451/54, 444, 72, 285–289; 34/19, 22.18, 133, 199

(56) References Cited

U.S. PATENT DOCUMENTS

| | | |
|---|---|---|
| 5,745,945 A | 5/1998 | Manfredi et al. |
| 5,944,590 A * | 8/1999 | Isobe et al. ............... 451/288 |
| 6,341,997 B1 * | 1/2002 | Lin .............................. 451/39 |
| 6,443,816 B2 * | 9/2002 | Inoue et al. ................. 451/56 |

FOREIGN PATENT DOCUMENTS

| | | |
|---|---|---|
| JP | 11129153 | 5/1999 |
| KR | 2000-0019355 | 4/2000 |

* cited by examiner

Primary Examiner—Lee D. Wilson
(74) Attorney, Agent, or Firm—Volentine Francos, PLLC

(57) ABSTRACT

A chemical mechanical polishing apparatus includes a polishing pad on which a wafer requiring planarization is placed, a conditioning disc having an abrasive surface for conditioning the polishing pad, a tank containing de-ionized water in which the conditioning disc soaks while standing by, and a cleaner for cleaning the conditioning disc. The conditioning disc cleaner is disposed in the tank of de-ionized water to remove polishing impurities from an abrasive surface of the conditioning disc. The cleaner may include a brush having bristles against which the abrasive surface of the conditioning disc is placed when it is lowered into the tank. In operation, after the wafer is polished, an abrasive surface of the conditioning disc is run over the upper surface of the polishing pad to condition the surface of the polishing pad. Then the conditioning disc is moved off of the upper surface of the polishing pad and to a stand-by position in which the abrasive surface of the disc is submerged in a liquid. Finally, while the conditioning disc is in its stand-by position, impurities are forced off of the abrasive surface and into the liquid by the cleaner disposed in the liquid. The conditioning disc is thus cleaned so that impurities are not transferred to the polishing pad during the next conditioning process.

9 Claims, 6 Drawing Sheets

CHEMICAL MECHANICAL POLISHING APPARATUS HAVING A CLEANER FOR CLEANING A CONDITIONING DISC AND METHOD OF CONDITIONING A POLISHING PAD OF THE APPARATUS

BACKGROUND OF THE INVENTION

1. Field of the Invention

The present invention relates to the polishing of wafers in the process of fabricating semiconductor devices. More particularly, the present invention relates to the conditioning of the polishing pad of a chemical mechanical polishing apparatus.

2. Description of the Related Art

As semiconductor devices become more highly integrated and more miniaturized, and as the number of layers of interconnections of the devices increase, the step difference at the surface of the device increases. Techniques for planarizing the stepped surface include the re-flowing of spin on glass (SOG) or borophosphosilicate glass (BPSG) and chemical mechanical polishing (CMP). Among these techniques, CMP is an essential process for manufacturing chips on a submicron scale using plasma enhanced chemical vapor deposition (PECVD) and reactive ion etch (RIE) processes.

A conventional chemical mechanical polishing (CMP) apparatus is shown in FIG. 1A. The CMP apparatus includes a polishing table 12, a polishing pad 14 mounted to the table 12, a slurry supply device 16 for supplying a slurry onto the polishing pad 14, a conditioning device 20 comprising a conditioning disc 22 for conditioning the polishing pad 14, a polishing head 18 for fixing a wafer W against the polishing pad 14, and a conditioner bath 24 comprising a tank filled with de-ionized water for cleaning the conditioning disc 22. The polishing table 12, the polishing head 18, and the conditioning disc 22 are driven by motors 11, 17, and 21, respectively.

In CMP, a wafer W is polished chemically by supplying the polishing slurry onto the polishing pad 14 so as to react with the material at the surface of the wafer. The wafer is also polished mechanically by pressing the wafer W against the polishing pad 14 with the polishing head 18 while the polishing head 18 and the polishing pad 14 are rotated. After the wafer W is planarized, the wafer W is transferred. Next, the conditioning disc 22 is moved onto the polished pad 14 to condition the polishing pad 14. After the polishing pad is conditioned, the conditioning disc 22 is soaked in de-ionized water 25 and is held in a stand-by position to prevent polishing slurry or a polishing by-product attached to the conditioning disc 22 from being exposed and being hardened and to remove the polishing solution or the polishing by-product.

However, the polishing slurry or polishing by-product comprises particles that are comparatively large. Thus, as shown in FIG. 1B, these particles 29 remain stuck between artificial diamonds 23 of the conditioning disc 22 even after the conditioning disc 22 has progressed to the stand-by position. Consequently, the polishing slurry or polishing by-product 29 can fall onto the polishing pad 14 during the subsequent conditioning process. Also, the force by which the diamonds 29 themselves are adhered to the conditioning disc 22 is reduced by the slurry so much so that the diamonds 23 can fall onto the polishing pad 14 during the conditioning process. The slurry, the polishing by-product, or materials which can fall onto the polishing pad will be referred to hereinafter as polishing impurities. The polishing impurities will scratch the surface of the wafer during the CMP process, whereby the quality of the semiconductor devices will be lowered, and the yield of the semiconductor devices will be correspondingly reduced.

SUMMARY OF THE INVENTION

An object of the present invention is to solve the above-described problem of the prior art by providing a CMP apparatus and method in which polishing impurities remaining on the conditioning disc after the conditioning process are removed from the conditioning disc prior to the next conditioning and hence, polishing process.

The chemical mechanical polishing apparatus includes a polishing pad, a conditioning device comprising a conditioning disc for conditioning the polishing pad, and a conditioner bath comprising a tank of liquid, such as de-ionized water, and a conditioning disc cleaner for cleaning the conditioning disc. The cleaner may be a brush having a plurality of bristles for applying pressure to and contacting the surface of the conditioning disc to remove impurities from the conditioning disc. Alternatively, the cleaner may be an ultrasound device.

The conditioning disc cleaner may be fixed in place in the tank of conditioner bath. In the case in which the conditioning disc cleaner is a brush, the conditioning disc is rotated against the bristles of the brush. On the other hand, the conditioning disc cleaner may include a motor for rotating the brush while the bristles of the brush contact the conditioning disc. The output speed of the motor for rotating the brush is less than or equal to 100 rpm.

The method of the present invention is performed as follows. First, a semiconductor wafer is set on the upper surface of the polishing pad. The wafer is pressed by the polishing head against the polishing pad to fix the wafer in place atop the pad. Slurry is introduced onto the polishing pad and the polishing pad is rotated. As a result, the slurry flows between the bottom surface of the wafer and the upper surface of the polishing pad, whereby the surface of the wafer is polished.

After the surface of the wafer is polished, the wafer is transferred by a robot arm or the like off of the polishing pad.

Now, the polishing of the wafer degrades the upper surface of the polishing pad. Therefore, after the wafer is transferred off of the polishing pad, the conditioning disc is run over the upper surface of the polishing pad to condition the surface of the polishing pad.

Once the upper surface of the polishing pad has been conditioned, the conditioning disc is moved off of the upper surface and into the liquid in the tank. The conditioning disc stands by as submerged in the liquid to prevent slurry or polishing by-products from hardening on the disc.

While the conditioning disc is at this stand-by position, polishing impurities are forced off of the abrasive surface and into the liquid by the conditioning disc cleaner. When the cleaner is a brush, the brush and/or the conditioning disc are rotated relative to each other while the bristles of the brush contact the abrasive surface of the conditioning disc. In this way, material that would otherwise act as an impurity during the next polishing apparatus is dislodged from the conditioning disc.

BRIEF DESCRIPTION OF THE DRAWINGS

The above and other objects, features and advantages of the present invention will become more apparent by referring to the following detailed description of the preferred embodiments thereof made with reference to the attached drawings, of which.

DETAILED DESCRIPTION OF THE PREFERRED EMBODIMENTS

Figure 2:
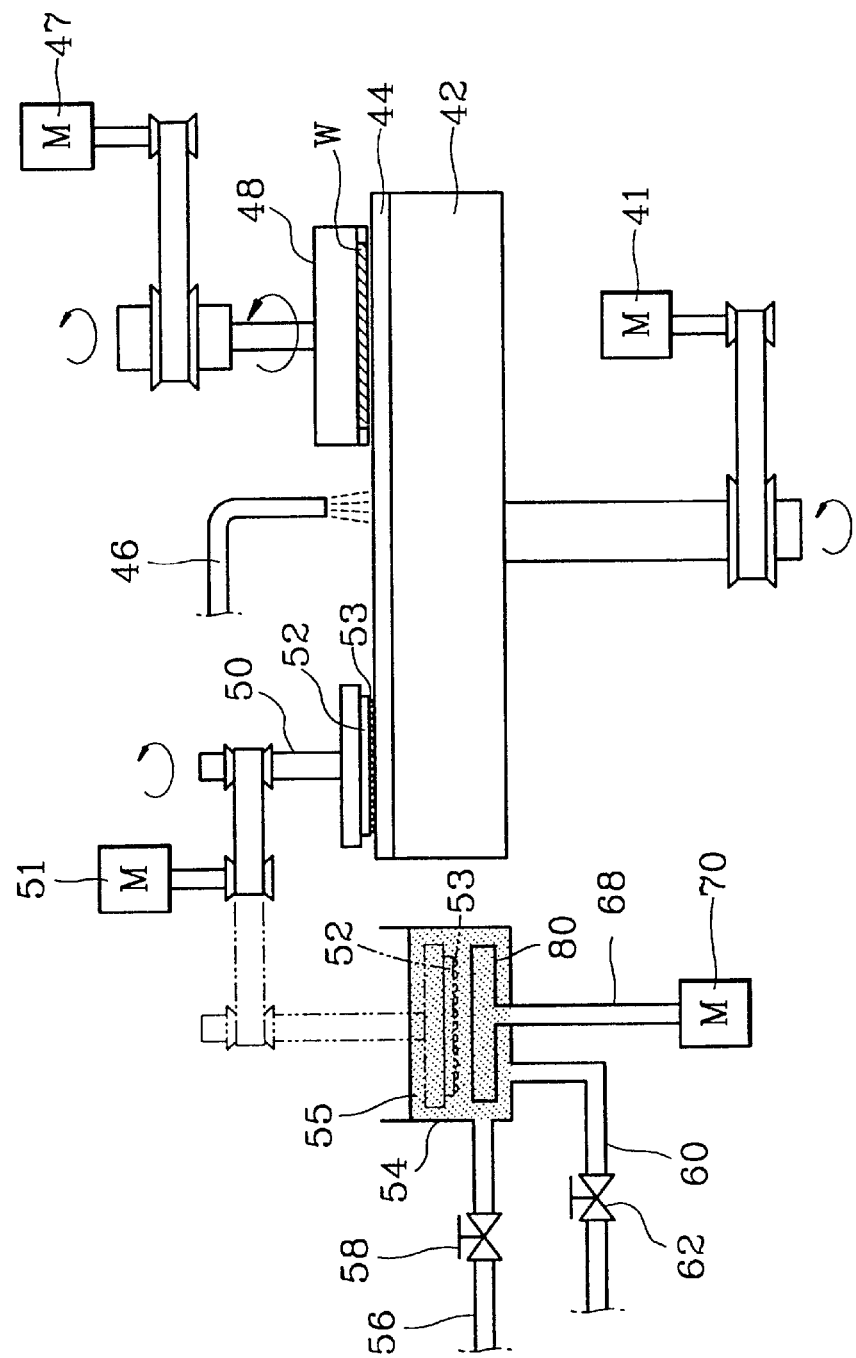
FIG. 2 is a schematic diagram of a CMP apparatus according to the present invention.

Referring to FIG. 2, a chemical mechanical polishing (CMP) apparatus includes a polishing table 42, a urethane polishing pad 44 attached to the polishing table 42, a slurry supply device 46 for supplying polishing slurry onto the polishing pad 44, a conditioning device 50 comprising a conditioning disc 52 for conditioning the polishing pad 44, and a polishing head 48 for fixing in place and applying pressure to a wafer W placed on the polishing pad 44. In order for the CMP apparatus to maintain a predetermined polishing rate, the conditioning disc 52 removes that portion of the surface of the polishing pad 44 that has been abraded during the polishing process, to thereby expose a new surface of the pad 44. In this way, the pad 44 can be used in the polishing of a batch of wafers.

Figure 1A:
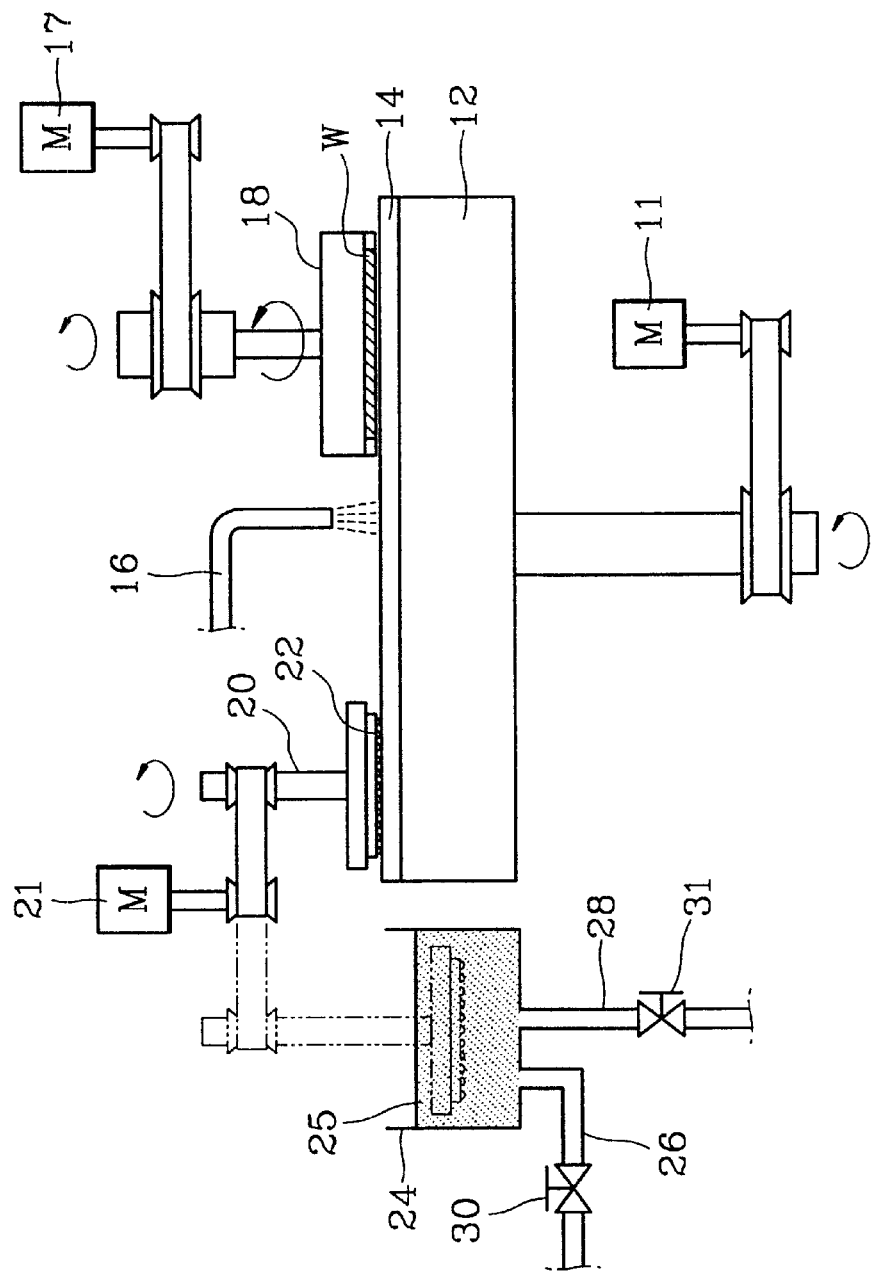
FIG. 1A is a schematic diagram of a conventional chemical mechanical polishing (CMP) apparatus used in the manufacturing of a semiconductor device.
Figure 1B:
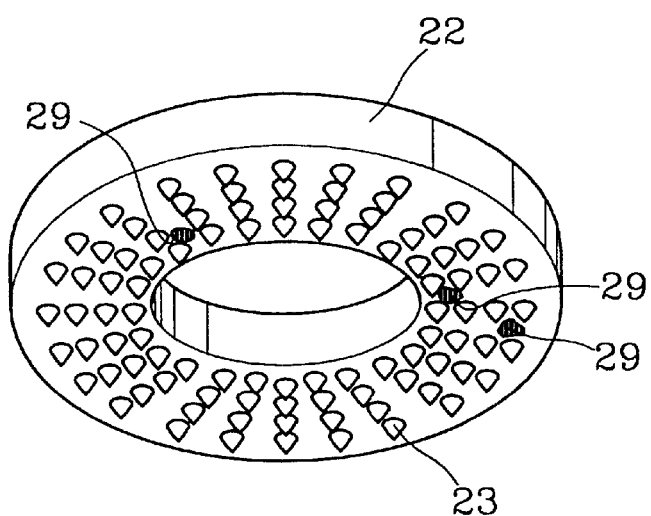
FIG. 1B is a perspective view of a conditioning disc of the CMP apparatus.

As shown in FIG. 1B, artificial diamonds 53 having a predetermined size are attached to the conditioning disc 52 by a nickel thin film. The polishing table 42 is rotated by driving a motor 41 installed under the polishing table 42, and the polishing head 48 is rotated or vibrated by driving of a motor 47 installed above the polishing head 48. The conditioning disc 52 is rotated by a motor 51 of the conditioning device 50.

The CMP apparatus also includes a conditioner bath 54 for soaking the conditioning disc 52 of the conditioner 50 in de-ionized water 55 and keeping the conditioning disc 52 in a stand-by position during the CMP process that follows the conditioning of the polishing pad 44 A pipe having a valve 58 is installed on the side of the tank of the conditioner bath 54 for supplying de-ionized water 56 into the tank of the bath. A pipe having a valve 62 is installed on the bottom of the tank of the conditioner bath 54 for draining de-ionized water 60 from the tank.

The conditioner bath 54 also includes a cleaner 80 for cleaning the conditioning disc 52 that is soaked in the de-ionized water 55 while the disc 52 stands by prior to the conditioning process. More specifically, the conditioning disc cleaner 80 removes polishing impurities that are stuck between the artificial diamonds 53 on the bottom of the conditioning disc 52. The conditioning disc cleaner 80 is disposed at the bottom of the tank of the conditioner bath 54, and is connected to a motor 70 through a rotary shaft 68. Alternatively, the conditioning disc cleaner 80 may be fixed in the tank of the conditioner bath 54.

Figure 3:
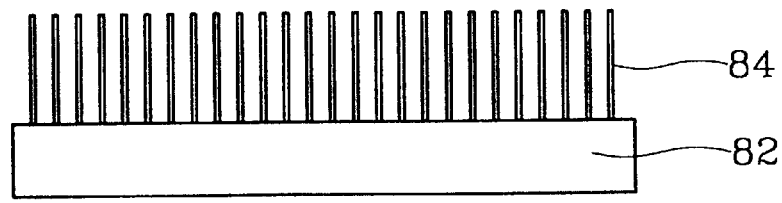
FIG. 3 is a side view of a brush of a cleaner for cleaning the conditioning disc of the CMP apparatus according to the present invention.

Referring to FIG. 3, the cleaner 80 is a brush comprising a main body 82 and a plurality of bristles 84. The main body 82 is of a durable material, such as Teflon® or a rust-proof sus material, that is resistant to de-ionized water. The main body, though, is preferably formed of Teflon®. Also, the main body 82 is preferably in the form of a circular disc, but may have other forms. The diameter or width of the main body 82 is 30 cm or less, for example, and preferably 10–20 cm.

Each bristle 84 is of an elastic material, such as nylon or a polymer, that does not strongly impact or damage the diamonds 53. Preferably, the length of each bristle 84 is 0.1 through 2 cm, and the thickness of each bristle is 0.1 cm or less.

Figure 4A:
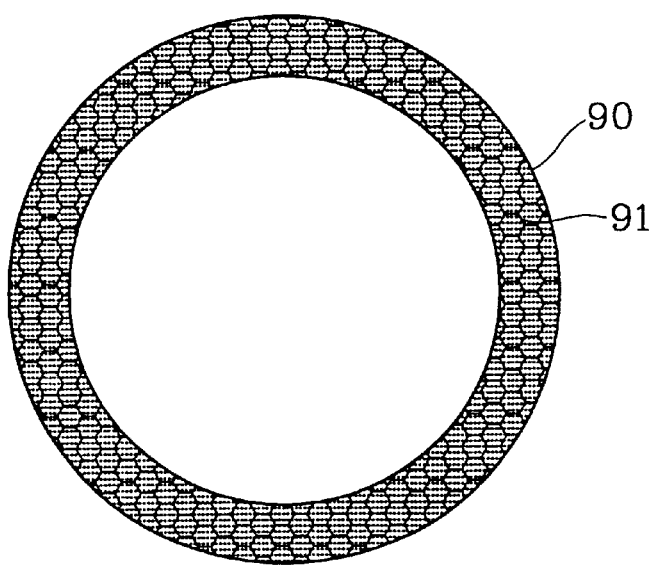
FIGS. 4A through 4C are plan views of respective forms of the brush of FIG. 3.
Figure 4B:
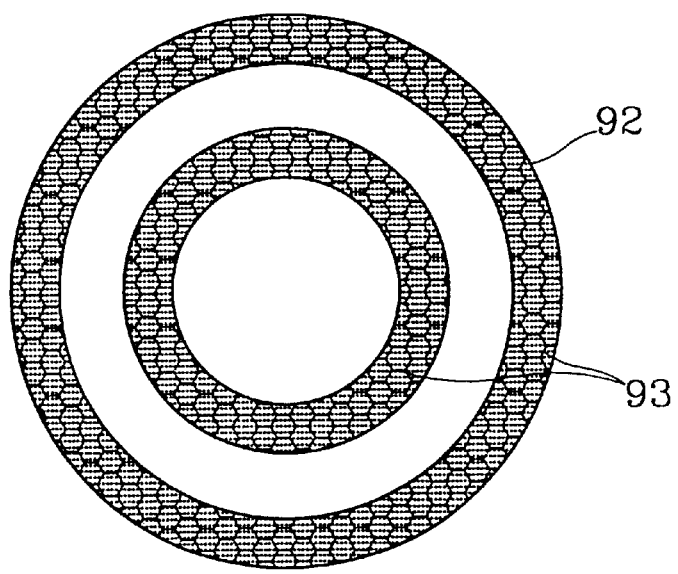
Figure 4C:
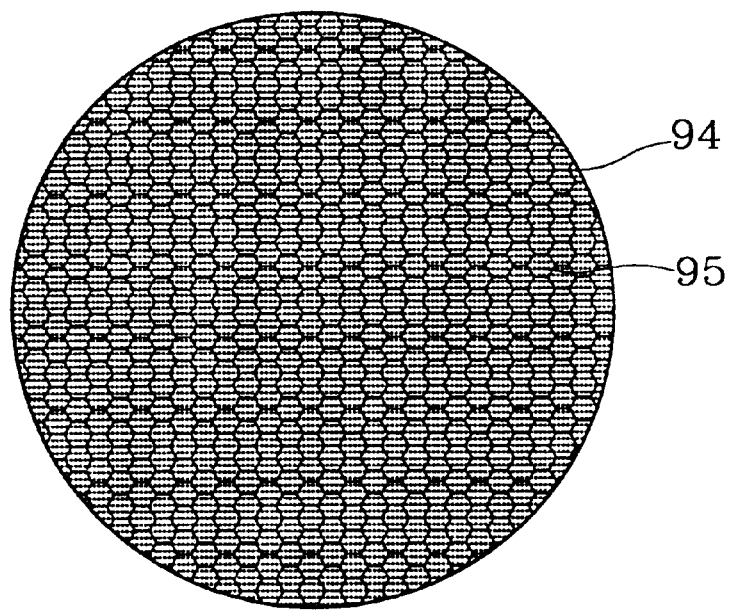

FIGS. 4A–4C show examples of the locations of the bristles when the main body is in the form of a circular disc. FIG. 4A shows a cleaner whose bristles 90 are disposed only along a circle at the outer periphery of the upper surface of the main body 91. FIG. 4B shows a cleaner whose bristles 93 are disposed along a circle at the outer periphery of the upper surface of the main body 92 and along a concentric circle located radially inwardly thereof. FIG. 4C shows a cleaner whose bristles 94 are disposed over the entire upper surface of the main body 95.

Figure 5A:
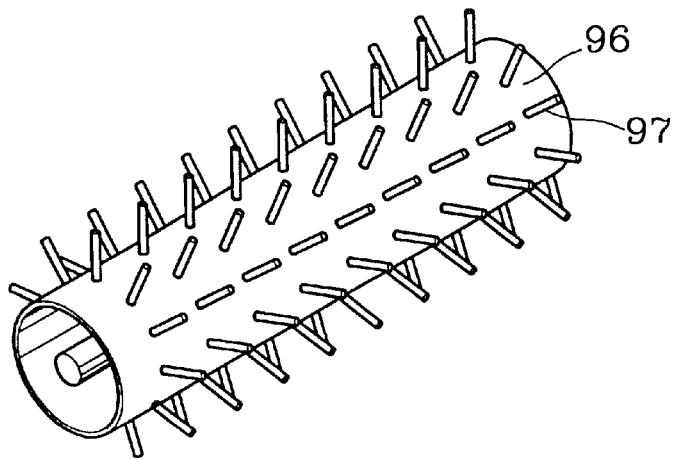
FIGS. 5A and 5B are perspective and side views, respectively, of a brush of a cleaner for cleaning the conditioning disc of another embodiment of the CMP apparatus according to the present invention.
Figure 5B:
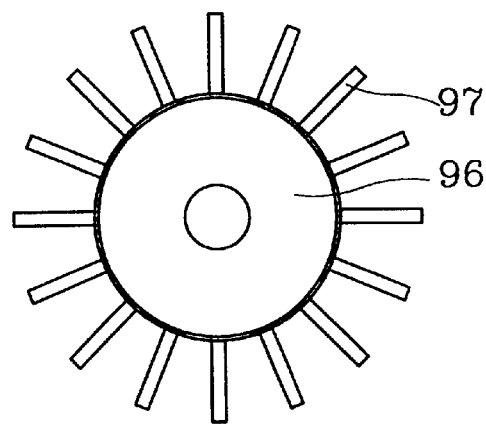

The cleaner may be a cylindrical brush as shown in FIGS. 5A and 5B. In this case, the cleaner comprises a plurality of bristles 97 disposed on the surface of a cylindrical main body 96. The bristles 97 are disposed over the entire surface of the main body 96 or over only part of the surface.

The CMP process, conditioning process, and cleaning process will now be described in more detail. When the wafer W is placed on the polishing pad 44 of the polishing table 42, the polishing head 48 fixes the wafer W in place. Then polishing slurry is supplied onto the polishing pad 44 by the slurry supply device 46, whereupon the polishing slurry flows into a space between the polishing pad 44 and the wafer W. Next, the motor 41 is driven to rotate the polishing table 42, and the motor 47 is driven to apply downward pressure to and rotate the polishing head 48. Accordingly, the surface of the wafer W pressed against the polishing pad 44 by the polishing head 48 is planarized. When one CMP batch process is completed, the wafer W is transferred from the CMP apparatus by a robot arm (not shown), and the motor 51 of the conditioning device 50 is operated to move the conditioning disc 52 onto the upper surface of the polished polishing pad 44. The conditioning disc 52 is rotated by the motor 51 to remove polishing impurities remaining in cavities in the upper surface of the polishing pad 44. When the conditioning process is completed, the conditioning disc 52 is transferred into the tank of the conditioner bath 54 by the motor 51 and a new CMP process is initiated. The conditioning disc 52 stands by in the de-ionized water 56 until the new CMP process is completed.

After the conditioning disc 52 has soaked in the de-ionized water 55 for some time, the polishing impurities remaining between the diamonds 53 of the conditioning disc 52 are removed by the cleaner 80.

Specifically, de-ionized water 55 is introduced into the tank of the conditioner bath 54 through the valve 58 and pipe 56, and the cleaner 80 is soaked in the de-ionized water 55. The conditioning disc 52 is transferred horizontally by the motor 51 to a position above the tank of the conditioner bath 54 and is then lowered into the tank of the conditioner bath 54 until the bottom surface of the conditioning disc 52 contacts the bristles 84. While the conditioning disc 52 remains fixed in position, the cleaner 80 is rotated by driving the motor 70. The speed of rotation of the motor 70 is less than or equal to 100 rpm. As a result, the bristles 84 of the cleaner 80 remove impurities from between the diamonds 53. For example, slurry, a by-product of the polishing process, and/or loose or excessively worn diamonds are removed.

The cleaning process can be performed by only operating the motor 51 to rotate the conditioning disc 52 against the bristles 84 of the cleaner 80. Alternatively, the conditioning disc 52 and the cleaner 80 may both be rotated to perform the cleaning process. The impurities removed from the conditioning disc 52 are entrained in the de-ionized water 55 and flowed out through the valve 62 and the pipe 60.

As is apparent from the foregoing description, the present invention removes the polishing impurities, such as particles stuck between the diamonds 53 attached to the bottom surface of the conditioning disc 52 or loose or abraded ones of the diamonds 53 themselves. Accordingly, the present invention minimizes the micro-scratching of the polishing pad during the subsequent polishing process.

Finally, although the present invention has been described above in connection with the preferred embodiments thereof, various changes thereto and modifications thereof will become apparent to those of ordinary skill in the art. For instance, an ultrasound device may be used instead of a brush member to remove the polishing impurities from the conditioning disc. Thus, all such changes and modifications are seen to be within the true spirit and scope of the present invention as defined by the appended claims.

What is claimed is:

1. A chemical mechanical polishing apparatus for manufacturing a semiconductor device, the chemical mechanical polishing apparatus comprising:

a polishing pad;

a conditioning disc having an abrasive surface for conditioning the polishing pad;

a conditioner bath comprising a tank for accommodating a liquid, and a brush disposed in the tank for cleaning the abrasive surface of the conditioning disc, said brush having a main body in the form of a disc having circular upper and lower surfaces, and a plurality of bristles extending from said upper surface of the main body so as to apply pressure to and contact the surface of the conditioning disc, said bristles being only disposed along two concentric circular areas on the upper surface of said main body, one of said areas including the outer peripheral portion of the upper surface, and the other of said areas being spaced radially inwardly thereof; and a driving mechanism connected to said conditioning disc and operative to move said disc between a conditioning position at which the abrasive surface thereof contacts the polishing pad and a stand-by position in said tank.

2. The chemical mechanical polishing apparatus according to claim 1, wherein the main body is of Teflon®.

3. The chemical mechanical polishing apparatus according to claim 1, and further comprising a motor operatively connected to said brush so as to rotate said brush within the tank.

4. The chemical mechanical polishing apparatus according to claim 3, wherein said motor is connected to said brush with a rotary output that rotates said brush at no more than 100 rpm.

5. The chemical mechanical polishing apparatus according to claim 1, wherein said driving mechanism is operative to rotate said conditioning disc about a central axis thereof.

6. The chemical mechanical polishing apparatus to claim 1, wherein said bristles are of a material selected from the group consisting of nylon and polymers.

7. The chemical mechanical polishing apparatus according to claim 6, wherein the length of each bristle is 0.1–0.2 cm.

8. The chemical mechanical polishing apparatus according to claim 6, wherein the length of each bristle is at most 0.1 cm.

9. The chemical mechanical polishing apparatus according to claim 1, wherein said brush is fixed in place in the tank of the conditioning bath.

* * * * *